United States Patent
Kim et al.

(10) Patent No.: US 11,921,946 B2
(45) Date of Patent: Mar. 5, 2024

(54) DISPLAY DEVICE INCLUDING A PIEZOELECTRIC SENSOR LAYER

(71) Applicant: SAMSUNG DISPLAY CO., LTD., Yongin-si (KR)

(72) Inventors: Do Ik Kim, Suwon-si (KR); Gwang Bum Ko, Suwon-si (KR); Sung Hwan Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/821,455

(22) Filed: Aug. 22, 2022

(65) Prior Publication Data

US 2022/0397974 A1 Dec. 15, 2022

Related U.S. Application Data

(62) Division of application No. 16/196,168, filed on Nov. 20, 2018, now abandoned.

(30) Foreign Application Priority Data

Dec. 8, 2017 (KR) .......................... 10-2017-0168375

(51) Int. Cl.
*G06F 3/041* (2006.01)
*G06F 3/043* (2006.01)
(Continued)

(52) U.S. Cl.
CPC ........ *G06F 3/0414* (2013.01); *G06F 3/04144* (2019.05); *G06F 3/0416* (2013.01);
(Continued)

(58) Field of Classification Search
CPC .. G06F 3/0414; G06F 3/04144; G06F 3/0416; G06F 3/0412; G06F 3/044;
(Continued)

(56) References Cited

U.S. PATENT DOCUMENTS

| 7,146,861 | B1 | 12/2006 | Cook et al. |
| 8,300,027 | B2 | 10/2012 | Kim et al. |

(Continued)

FOREIGN PATENT DOCUMENTS

| CN | 102662535 | 9/2012 |
| CN | 104407786 | 3/2015 |

(Continued)

OTHER PUBLICATIONS

English Translation for WO0038104A1 (Year: 2000).*

*Primary Examiner* — Roberto W Flores
(74) *Attorney, Agent, or Firm* — F. CHAU & ASSOCIATES, LLC

(57) ABSTRACT

A display device that senses externally applied pressure and a change in the resonant frequency of a piezoelectric element. The display device includes a piezoelectric sensor layer including a piezoelectric sensor; and a display panel disposed on the piezoelectric sensor layer. The piezoelectric sensor includes: a piezoelectric element having a first electrode, a second electrode facing the first electrode, and a piezoelectric material disposed between the first electrode and the second electrode; an alternating current (AC) voltage generator connected to the first electrode and applies a voltage having a resonance frequency to the piezoelectric element. A sensing circuit connected to the second electrode is configured to measure a change in impedance of the piezoelectric element.

13 Claims, 16 Drawing Sheets

(51) Int. Cl.
   *H10K 50/84*   (2023.01)
   *H10K 59/40*   (2023.01)
   *H10N 30/30*   (2023.01)
   *G06F 3/044*   (2006.01)
   *G06F 3/046*   (2006.01)
   *H10K 59/12*   (2023.01)

(52) U.S. Cl.
   CPC ............ *G06F 3/043* (2013.01); *H10K 50/841* (2023.02); *H10K 59/40* (2023.02); *H10N 30/302* (2023.02); *G06F 3/0412* (2013.01); *G06F 3/044* (2013.01); *G06F 3/046* (2013.01); *G06F 2203/04101* (2013.01); *G06F 2203/04105* (2013.01); *H10K 59/12* (2023.02)

(58) Field of Classification Search
   CPC ............ G06F 3/046; G06F 2203/04101; G06F 2203/04105; G06F 3/041–047; G06F 3/043–0436; H10K 50/841; H10K 59/40; H10K 59/12; H10N 30/302; G02F 1/13338; G06V 40/12–1394; G06V 40/1306
   See application file for complete search history.

(56) References Cited

U.S. PATENT DOCUMENTS

| | | | |
|---|---|---|---|
| 8,461,760 B1 | 6/2013 | Oh et al. | |
| 8,941,619 B2 | 1/2015 | Lee | |
| 9,569,055 B2 | 2/2017 | Post et al. | |
| 9,753,547 B2 | 9/2017 | Liu et al. | |
| 9,990,078 B2 | 6/2018 | Khoshkava et al. | |
| 10,042,604 B2 | 8/2018 | Post et al. | |
| 10,108,305 B2 | 10/2018 | Post et al. | |
| 10,185,441 B2 | 1/2019 | Khoshkava et al. | |
| 10,303,279 B2 | 5/2019 | Wang et al. | |
| 10,318,090 B2 | 6/2019 | Post et al. | |
| 10,397,679 B2 | 8/2019 | Hecht et al. | |
| 10,474,279 B2 | 11/2019 | Hwang et al. | |
| 10,651,964 B2 | 2/2020 | Khoshkava et al. | |
| 10,649,588 B2 | 5/2020 | Amin et al. | |
| 10,965,983 B2 | 3/2021 | Post et al. | |
| 2004/0032399 A1 | 2/2004 | Sekiguchi et al. | |
| 2004/0093947 A1* | 5/2004 | Brederlow | G01N 29/036 73/590 |
| 2010/0289740 A1 | 11/2010 | Kim et al. | |
| 2011/0113898 A1 | 5/2011 | Sato et al. | |
| 2012/0133448 A1 | 5/2012 | Gregg et al. | |
| 2013/0016047 A1 | 1/2013 | Masumoto | |
| 2013/0076686 A1 | 3/2013 | Kono | |
| 2013/0265256 A1 | 10/2013 | Nathan et al. | |
| 2014/0092053 A1 | 4/2014 | Ng et al. | |
| 2014/0300251 A1* | 10/2014 | Colli | G06F 3/03547 29/25.35 |
| 2015/0123931 A1 | 5/2015 | Kitchens et al. | |
| 2015/0212548 A1 | 7/2015 | Namkung et al. | |
| 2015/0242024 A1* | 8/2015 | Majava | G06F 3/046 345/174 |
| 2016/0103543 A1 | 4/2016 | Kessler et al. | |
| 2016/0117034 A1 | 4/2016 | Day | |
| 2016/0117036 A1 | 4/2016 | Watazu et al. | |
| 2016/0253020 A1 | 9/2016 | Frey | |
| 2016/0306481 A1 | 10/2016 | Filiz et al. | |
| 2016/0373861 A1 | 12/2016 | Hecht et al. | |
| 2017/0168630 A1 | 6/2017 | Khoshkava et al. | |
| 2018/0046302 A1 | 2/2018 | Wang et al. | |
| 2018/0095581 A1 | 4/2018 | Hwang et al. | |
| 2018/0113345 A1 | 4/2018 | Song et al. | |
| 2018/0181277 A1 | 6/2018 | Ahn | |
| 2018/0199124 A1 | 7/2018 | Hecht et al. | |
| 2019/0095002 A1 | 3/2019 | Bohannon et al. | |
| 2019/0179471 A1 | 6/2019 | Kim et al. | |

FOREIGN PATENT DOCUMENTS

| | | |
|---|---|---|
| CN | 104903824 | 9/2015 |
| CN | 105843446 | 8/2016 |
| CN | 106896910 | 6/2017 |
| CN | 107004756 | 8/2017 |
| CN | 206574060 | 10/2017 |
| CN | 110383225 | 10/2019 |
| GB | 2554771 A | 4/2018 |
| JP | 2005-062150 | 3/2005 |
| JP | 2005-522791 | 7/2005 |
| JP | 2017-146664 | 8/2017 |
| KR | 10-2006-0036646 | 5/2006 |
| KR | 10-2015-0090743 | 8/2015 |
| KR | 10-2016-0081949 | 7/2016 |
| KR | 10-2010-0074819 | 7/2020 |
| WO | WO-0038104 A1 * | 6/2000 ........... G06F 3/0433 |

* cited by examiner

DISPLAY DEVICE INCLUDING A PIEZOELECTRIC SENSOR LAYER

This application is a division of U.S. patent application Ser. No. 16/196,168 filed on Nov. 20, 2018, which claims priority to Korean Patent Application No. 10-2017-0168375, filed on Dec. 8, 2017, with the Korean Intellectual Property Office, the disclosures of which are incorporated by reference herein in their entirety.

TECHNICAL FIELD

The inventive concept relate to a display device including technology to sense contact with the display panel of the display device.

DISCUSSION OF THE RELATED ART

With the development of multimedia, display devices are becoming increasingly popular. Accordingly, various types of display devices such as liquid crystal displays and organic light emitting displays are now in use. Of these display devices, liquid crystal displays are one of the most widely used types of flat panel displays. A liquid crystal display includes a pair of substrates having field generating electrodes, such as pixel electrodes and a common electrode, and a liquid crystal layer interposed between the two substrates. In the liquid crystal display, voltages are applied to the field generating electrodes to generate an electric field in the liquid crystal layer. In addition, organic light emitting displays display images using an organic light emitting diode that generates light through the recombination of electrons and holes. Such organic light emitting displays have a fast response speed, high luminance, wide viewing angle, and low power consumption.

SUMMARY

Embodiments of the inventive concept provide a display device which can sense the pressure applied from the outside.

Embodiments of the inventive concept also provide a display device which can measure the distance between an external object and the display device or the distance traveled by the external object.

However, embodiments of the inventive concept are not restricted to the description set forth herein. The embodiments of the inventive concept will be better-appreciated by a person of ordinary skill in the art to which the inventive concept pertains by referencing the detailed description hereinbelow.

According to an embodiment of the inventive concept, there is provided a display device including: a piezoelectric sensor layer including a piezoelectric sensor comprising a piezoelectric element; and a display panel disposed on the piezoelectric sensor layer. The piezoelectric sensor includes a sensing circuit connected to the piezoelectric element, and wherein the sensing circuit is configured to measure a change in impedance of the piezoelectric element when an alternating current (AC) voltage having a resonance frequency of the piezoelectric element is input to the piezoelectric element.

In addition, the piezoelectric element of the piezoelectric sensor includes a first electrode, a second electrode facing the first electrode, and a piezoelectric material disposed between the first electrode and the second electrode; and wherein the piezoelectric sensor further includes an AC voltage generator connected to the first electrode, the AC voltage generator configured to provide the AC voltage having the resonance frequency to the piezoelectric element.

In addition, the sensing circuit may include: a first node connected to the second electrode; a sensing resistor and an amplifier connected to the first node; and an analog-to-digital converter connected to the amplifier.

In addition, the display device may further include a rectifier circuit electrically connected between the amplifier and the analog-to-digital converter.

In addition, when pressure is applied to the piezoelectric sensor, an impedance value of the piezoelectric element may increase.

The piezoelectric element may include a plurality of piezoelectric elements disposed on the base film in an array.

The window may be constructed of a material that transmits an externally applied pressure to the piezoelectric element.

In addition, the piezoelectric sensor layer may further include: a base film on which the piezoelectric element is disposed; a pad which is disposed on the base film; and an input line which connects the pad and the piezoelectric element.

In addition, the display panel may include a driving integrated circuit, and the pad may be electrically connected to the driving integrated circuit.

In addition, the driving integrated circuit may include a plurality of analog-to-digital converters, and the piezoelectric element may be connected to the analog-to-digital converters.

In addition, the display device may further include an input sensing circuit which is disposed on the display panel.

In addition, the display panel may include a plurality of pixels, and each of the pixels may include a pixel electrode, a common electrode facing the pixel electrode, and an organic light emitting layer disposed between the pixel electrode and the common electrode.

According to another embodiment of the inventive concept, there is provided a display device including: a piezoelectric sensor layer including a piezoelectric sensor; and a display panel disposed on the piezoelectric sensor layer, wherein the piezoelectric sensor includes: a transmitter including a first piezoelectric element and an AC voltage generator providing a voltage having a resonance frequency to the first piezoelectric element; and a receiver including a second piezoelectric element and a sensing circuit measuring a current generated from the second piezoelectric element.

In addition, when the voltage having the resonance frequency is provided to the first piezoelectric element, the first piezoelectric element may generate an ultrasonic signal.

In addition, the ultrasonic signal may return as a reflected signal after hitting an object, and the second piezoelectric element may receive the reflected signal to generate a current.

In addition, the display device may further include a controller which is connected to the sensing circuit, wherein, when the transmitter transmits the ultrasonic signal, the receiver may receive the reflected signal after a first time, and the controller may calculate a vertical distance between the object and the display device based on the first time.

In addition, the piezoelectric sensor layer may include a base film and a plurality of piezoelectric elements disposed on the base film along a plurality of columns and a plurality of rows.

In addition, the display device may further include a controller which is connected to the sensing circuit, wherein the piezoelectric sensor may include a plurality of receivers, and the receivers may collect position information of an object, and the controller may map the position information of the object on an x-y plane.

In addition, the controller may calculate a horizontal movement distance of the object based on the position information of the object.

In addition, the first piezoelectric element and the second piezoelectric element may be integrated.

According to another embodiment of the inventive concept, there is provided a display device including: a piezoelectric sensor layer including a piezoelectric sensor; and a display panel disposed on the piezoelectric sensor layer, wherein the piezoelectric sensor includes: a piezoelectric element having a first electrode, a second electrode facing the first electrode, and a piezoelectric material disposed between the first electrode and the second electrode; an AC voltage generator connected to the first electrode and applies a voltage having a variable frequency to the piezoelectric element; and a sensing circuit connected to the second electrode and configured to measure a change in a resonance frequency of the piezoelectric element.

In addition, the sensing circuit may be configured to measure a first resonance frequency having a lowest impedance value among various frequencies in a state where no pressure is applied to the piezoelectric element and measure a second resonance frequency having the lowest impedance value among the various frequencies in a state where pressure is applied to the piezoelectric element, wherein the first resonance frequency and the second resonance frequency may be different from each other.

BRIEF DESCRIPTION OF THE DRAWINGS

The embodiments of the inventive concept will become more readily appreciated by a person of ordinary skill in the art from the following description, taken in conjunction with the accompanying drawings in which.

DETAILED DESCRIPTION OF THE EMBODIMENTS

Figure 1:
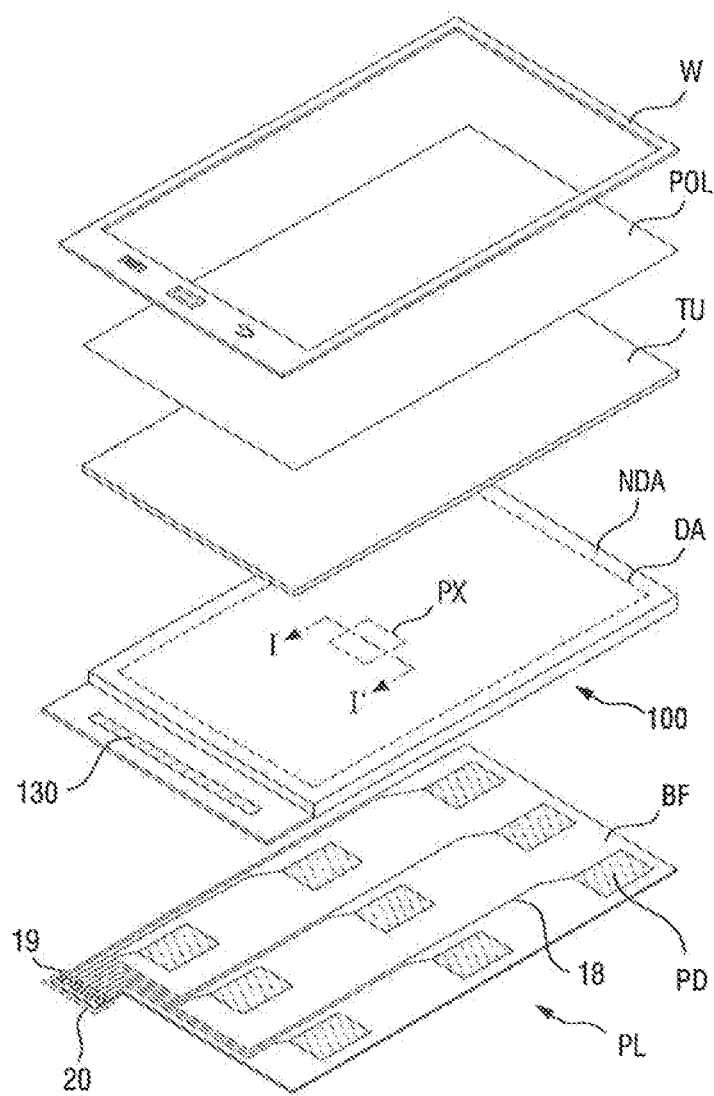
FIG. 1 is an exploded perspective view of a display device according to an embodiment of the inventive concept.

A person of ordinary skill in the art will understand and appreciate the embodiments of the inventive concept that are described in detail herein below with reference to the accompanying drawings. However, the inventive concept is not limited to the embodiments disclosed hereinafter, but can be implemented in diverse forms. The matters defined in the description, such as the detailed construction and elements, are provided to assist those of ordinary skill in the art with a comprehensive understanding of the embodiments of the inventive concept.

Where an element is described as being related to another element, for example, being "on" another element or "located on" a different layer or a layer, includes both a case where an element is located directly on another element or a layer and a case where an element is located on another element via another layer or still another element. In contrast, where an element is described as being is related to another element such as being "directly on" another element or "located directly on" a different layer or a layer, indicates a case where an element is located on another element or a layer with no intervening element or layer therebetween. The same drawing reference numerals are used for the same elements across various figures.

Although the terms "first, second, and so forth" are used to describe diverse constituent elements, such constituent elements are not limited by the terms. The terms are used only to discriminate a constituent element from other constituent elements. Accordingly, in the following description, a first constituent element may be a second constituent element.

The terminology used herein is for the purpose of describing particular embodiments only and is not intended to be limiting. As used herein, the singular forms "a," "an," and "the" are intended to include the plural forms, including "at least one," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, for example, those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the inventive concept are described herein with reference to cross-section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the inventive concept will be described with reference to the attached drawings.

FIG. 1 is an exploded perspective view of a display device according to an embodiment of the inventive concept. Referring to FIG. 1, the display device according to this embodiment of the inventive concept may include a piezoelectric sensor layer PL, a display panel 100, an input sensing unit TU, and a cover window W.

In an embodiment of the inventive concept, the piezoelectric sensor layer PL may include a base film BF and at least one piezoelectric sensor PS formed on the base film BF.

The base film BF is a plate-like film and may provide a space in which the piezoelectric sensor PS is disposed.

In an embodiment of the inventive concept, the base film BF may be made of a transparent or translucent material.

In an embodiment of the inventive concept, the base film BF may have flexibility. For example, the base film BF may be at least partially bent or folded.

In an embodiment of the inventive concept, the base film BF may include polyethylene terephthalate (PET) or polyimide (PI).

The piezoelectric sensor PS (see FIG. 2) may be disposed on the base film BF. The piezoelectric sensor PS may include one or more piezoelectric elements PD.

The piezoelectric elements PD may be connected to an input line 18. A pad 19 may be formed at an end of the input line 18, and a pad unit 20 where a plurality of pads 19 are gathered may be disposed at an end of the piezoelectric sensor layer PL.

In an embodiment of the inventive concept, the pad unit 20 may be electrically connected to a driving integrated circuit 130 of the display panel 100 to be described hereinafter. The display device according to an embodiment of the inventive concept may further include a circuit film (not illustrated) which connects the pad unit 20 and the driving integrated circuit 130. However, this is merely an example, and the pad unit 20 and the driving integrated circuit 130 may not be connected by the circuit film.

The piezoelectric sensor PS will now be described in detail with reference to FIG. 2.

Figure 2:
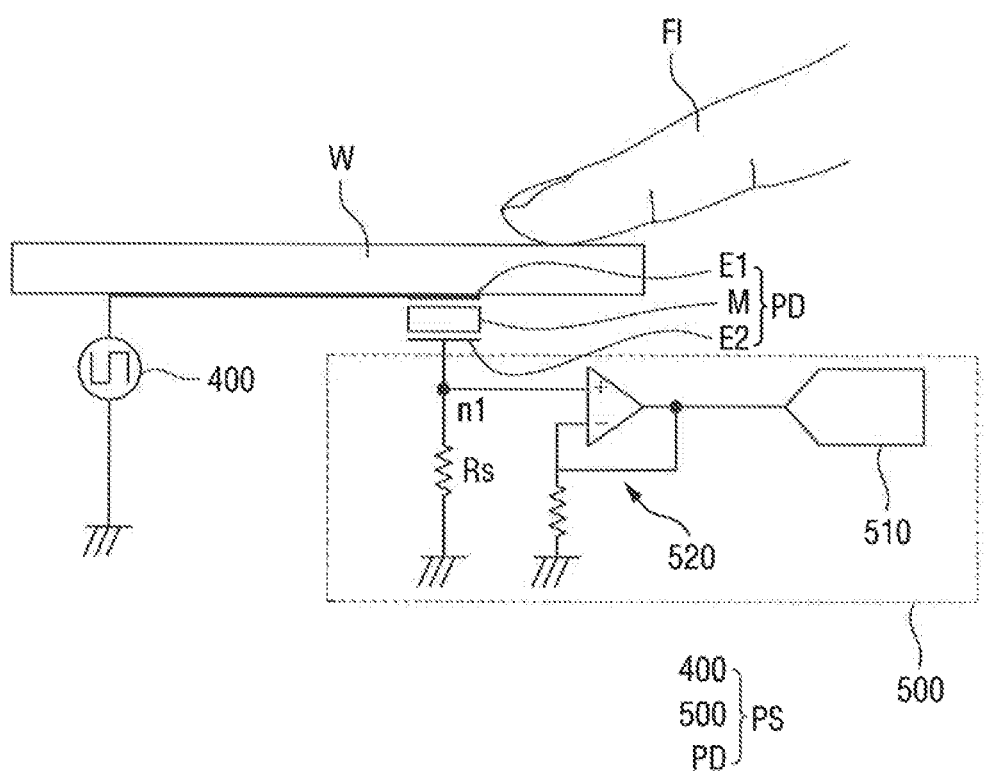
FIG. 2 is a schematic diagram of the display device according to the embodiment of FIG. 1.

FIG. 2 is a schematic diagram of the display device according to the embodiment of FIG. 1.

Referring to FIG. 2, the piezoelectric sensor PS may include a piezoelectric element PD, an alternating current (AC) voltage generator 400, and a sensing circuit 500.

In an embodiment of the inventive concept, the piezoelectric element PD may include a first electrode E1, a second electrode E2 facing the first electrode E1, and a piezoelectric material M disposed between the first electrode E1 and the second electrode E2.

The first electrode E1 and the second electrode E2 may face each other and may be spaced apart from each other by a predetermined distance. For example, the first electrode E1 and the second electrode E2 may form facing electrodes of a capacitor.

The piezoelectric material M may be interposed between the first electrode E1 and the second electrode E2. The piezoelectric material M is a material having a piezoelectric effect and can expand or contract in response to a voltage.

In an embodiment of the inventive concept, the piezoelectric material M may include, for example, any one or more of quartz. Rochelle salt, barium titanate, and ceramics.

The AC voltage generator 400 may be connected to the first electrode E1 of the piezoelectric element PD. The AC voltage generator 400 may apply an AC voltage to the piezoelectric element PD.

In an embodiment of the inventive concept, the waveform of the voltage applied by the AC voltage generator 400 may be a sine wave or a square wave.

In an embodiment of the inventive concept, the AC voltage generator 400 may apply a voltage having a resonance frequency to the piezoelectric element PD.

For ease of description, some terms will be defined hereinbelow with reference to FIG. 3.

Figure 3:
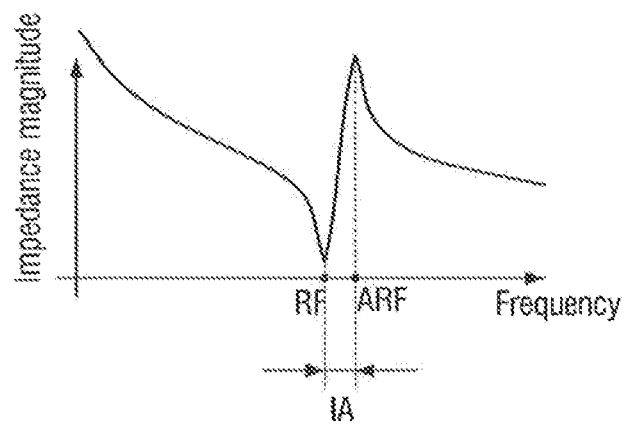
FIG. 3 is a graph illustrating a frequency-impedance relationship in a piezoelectric sensor.

FIG. 3 is a graph illustrating a frequency-impedance relationship in the piezoelectric sensor PS.

Referring to FIG. 3, a resonance frequency RF may be defined as a frequency at which the impedance of the piezoelectric element PD has a minimum value in a specific section in which resonance occurs, and an anti-resonance frequency ARF may be defined as a frequency at which the impedance of the piezoelectric element PD has a maximum value in a specific section in which resonance occurs.

Referring again to FIG. 2, the sensing circuit 500 may be connected to the second electrode E2 of the piezoelectric element PD.

The sensing circuit 500 may measure the impedance presented to the piezoelectric element PD or a change in the impedance as explained hereinbelow.

In an embodiment of the inventive concept, the sensing circuit 500 may include a sensing resistor Rs, an amplifier 520, and an analog-to-digital converter 510.

The second electrode E2 may be connected to a first node n1. The sensing circuit 500 may measure the impedance of the piezoelectric element PD by measuring a current supplied to the first node n1.

The first node n1 may be connected to the sensing resistor Rs and the amplifier 520.

Accordingly, a current may flow from the second electrode E2 to the sensing resistor Rs, and the amplifier 520 may measure the current of the first node n1. In addition, the analog-to-digital converter 510 may convert an analog signal received from the amplifier 520 into a digital signal.

Although not illustrated in the drawings, the display device according to an embodiment of the inventive concept may further include a controller which is connected to the analog-to-digital converter 510 and processes a signal received from the analog-to-digital converter 510.

Next, the operation of a piezoelectric sensor PS according to an embodiment of the inventive concept will be described. For example, the pressure applied to the window W may be transmitted to the piezoelectric element PD. For example, FIG. 2 illustrates a case where a finger F1 applies pressure to the window W. However, a person of ordinary skill in the art should understand and appreciate that embodiments of the inventive concept are not limited to the finger F1 applying pressure to the window W. For example, a stylus may also be used to apply pressure to the window W, and may allow for a more precise selection of an item displayed on the display panel than the finger F1.

When pressure is applied to the piezoelectric element PD, for example, by an object pressing on the window W that in turn applies pressure on the piezoelectric element PD, the pressure on the piezoelectric element PD causes the piezoelectric material to generate a voltage, which may cause a change in the impedance presented to the piezoelectric element PD.

Figure 4:
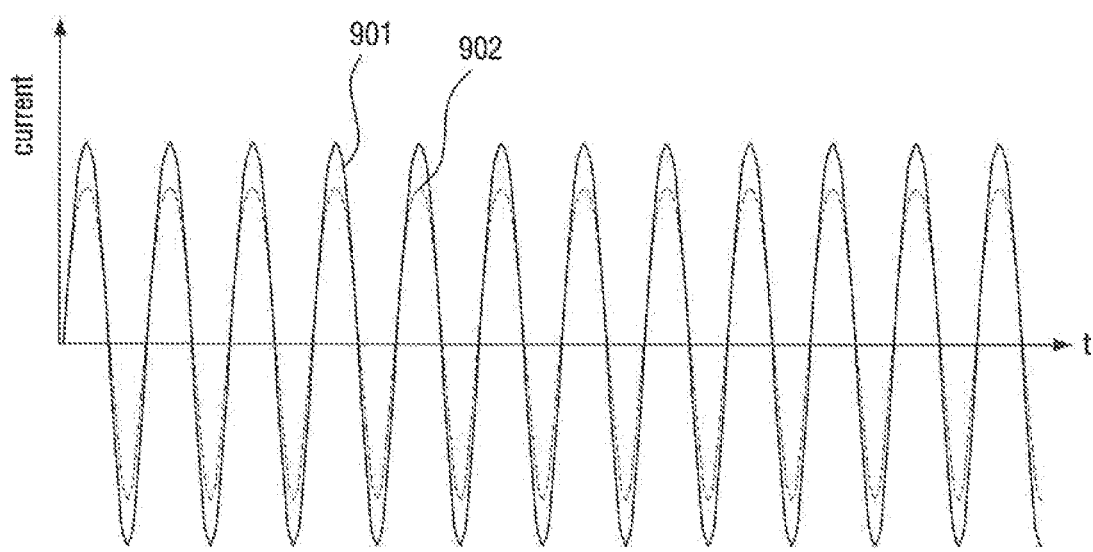
FIG. 4 is a graph illustrating the change in an amount of current when pressure is applied to a piezoelectric element and when no pressure is applied to the piezoelectric element.

FIG. 4 is a graph illustrating an example of a change in the amount of current when pressure is applied to the piezoelectric element PD, and an example of when there is no pressure being applied to the piezoelectric element PD.

Referring to FIG. 4, a person of ordinary skill in the art can see that the amount of current is smaller in a state 902 where pressure is applied to the piezoelectric element PD than in a state 901 where no pressure is applied to the piezoelectric element PD. In other words, the impedance may be greater in the state 902 where pressure is applied to the piezoelectric element PD than in the state 901 where no pressure is applied to the piezoelectric element PD.

As described above, an AC voltage having a resonance frequency may be applied to the piezoelectric element PD. If the piezoelectric element PD is stimulated in a state where the AC voltage having the resonance frequency is applied to the piezoelectric element PD, the amount of change in impedance can be immediately and continuously identified.

For example, since the change in impedance is greater in the resonance frequency state than in other frequency regions, the impedance can be accurately detected in the resonance frequency state.

In addition, by measuring the continuous change in the impedance, it is possible to identify whether the pressure is being continuously applied to the piezoelectric element PD or has been released after being applied to the piezoelectric element PD.

In addition, when the pressure applied to the piezoelectric element PD is released, the impedance may return to the state prior to the pressure being applied. Based on this change in the impedance, it is possible to detect whether a user, who has pressed on the window W with a finger or an object (e.g., a stylus), continues to press on the window W with his or her finger, or to detect whether the user has taken his or her finger off the window W after pressing the window W.

Accordingly, the piezoelectric sensor PS that is configured as described above can more precisely and accurately measure the pressure applied to the display device.

Referring again to FIG. 1, the display panel 100 may be disposed on the piezoelectric sensor layer PL.

The display panel 100 may display an image. In an embodiment of the inventive concept, the display panel 100 may be a part of an organic light emitting display device. For ease of description, the display panel 100 will hereinafter be described as a display panel of an organic light emitting display device. However, embodiments of the inventive concept are not limited to this case. For example, in an embodiment of the inventive concept, the display panel 100 may be a display panel of a liquid crystal display device.

Figure 5:
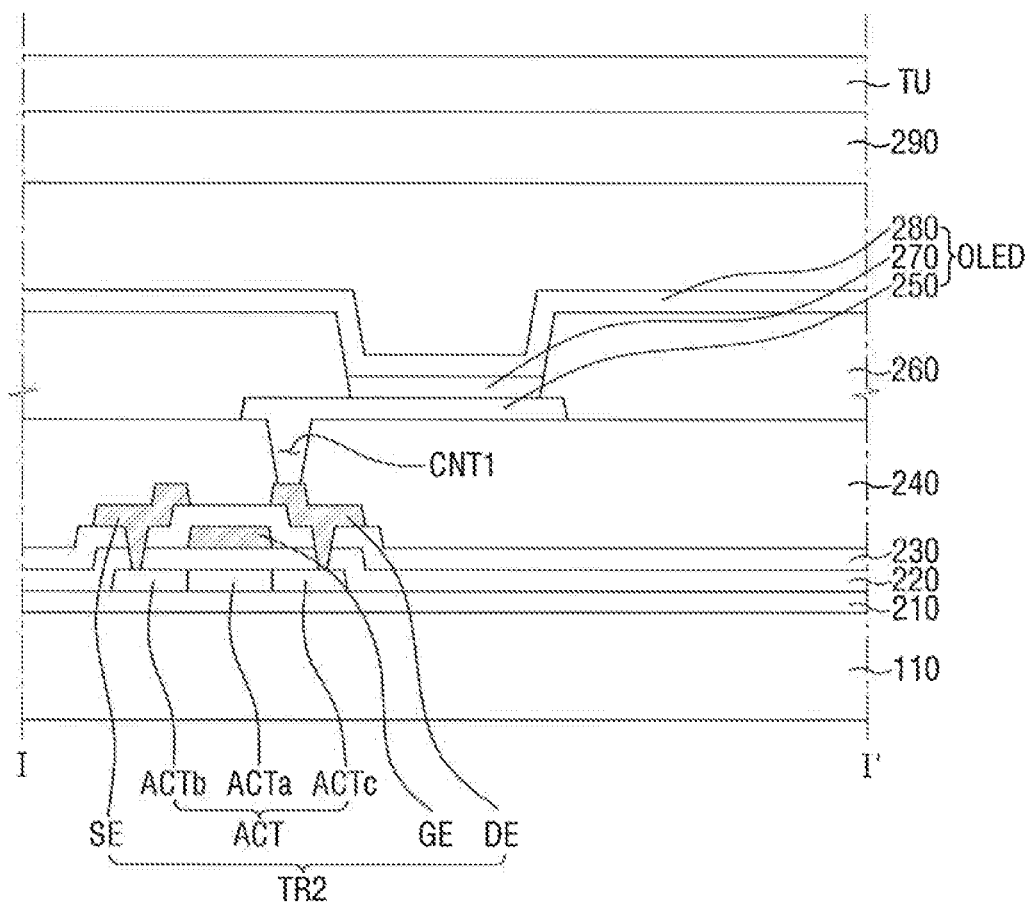
FIG. 5 is a cross-sectional view taken along the line I-I' of FIG. 1.

The display panel 100 may include a first substrate 110 and a second substrate 290 facing each other (see FIG. 5).

The first substrate 110 may be an insulating substrate. In an embodiment of the inventive concept, the first substrate 110 may include a material such as, for example, glass, quartz, or polymer resin. Here, the polymer material may be, for example, polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination of these materials.

FIG. 1 also shows that the first substrate 110 may include a display area DA and a non-display area NDA.

The display area DA is defined as an area that displays an image. A display unit 120 is disposed on the display area DA. A plurality of pixels PX for realizing an image are disposed on the display unit 120.

The non-display area NDA is disposed along an area outside of (e.g., a periphery) the display area DA and defined as an area that does not display an image. In an embodiment of the inventive concept, the non-display area NDA may surround the display area DA. In FIG. 1, the non-display area NDA surrounds the display area DA. However, embodiments of the inventive concept are not limited to this case. In an embodiment of the inventive concept, the non-display area NDA may be disposed adjacent to one side, or to some but not all of the sides of the display area DA, or may be disposed adjacent to one side or both sides of the display area DA.

The driving integrated circuit 130 may be disposed in the non-display area NDA. The driving integrated circuit 130 may generate a signal that may be utilized to drive the display area DA, and to transmit the signal to the display area DA.

In an embodiment of the inventive concept, the driving integrated circuit 130 may include a plurality of analog-to-digital converters.

As described above, the piezoelectric sensor PS may include the analog-to-digital converter 510. In addition, the pad unit 20 of the piezoelectric sensor layer PL and the driving integrated circuit 130 of the display panel 100 may be electrically connected to each other. When the pad unit 20 and the driving integrated circuit 130 are connected, the piezoelectric sensor PS may have use of some of the analog-digital converters included in the driving integrated circuit 130.

Next, a pixel PX will be described in detail with reference to FIG. 5. FIG. 5 is a cross-sectional view taken along the line I-I' of FIG. 1.

Referring to FIG. 5, a buffer layer 210 may be disposed on the first substrate 110. The buffer layer 210 may prevent the penetration of moisture and oxygen from the outside through the first substrate 110. In addition, the buffer layer 210 may be disposed on the first substrate 110 to planarize the surface of the first substrate 110. In an embodiment of the inventive concept, the buffer layer 210 may include any one of a silicon nitride (SiNx) film, a silicon oxide (SiO$_2$) film, and a silicon oxynitride (SiOxNy) film. The buffer layer 210 can be omitted depending on the type of the first substrate 110 or process conditions.

A semiconductor layer including a semiconductor pattern ACT may be disposed on the buffer layer 210. The semiconductor layer will now be described based on the semiconductor pattern ACT. In an embodiment of the inventive concept, the semiconductor pattern ACT may be made of a mixture of one or more of polycrystalline silicon, monocrystalline silicon, low-temperature polycrystalline silicon, amorphous silicon, and an oxide semiconductor. The semiconductor pattern ACT may include, in an embodiment of the inventive concept, a channel region ACTa that is not doped with an impurity, and a source region ACTb and a drain region ACTc doped with an impurity. The source region ACTb is located on one side of the channel region ACTa and is electrically connected to a source electrode SE to be described hereinafter. The drain region ACTc is located on the other side of the channel region ACTa and is electrically connected to a drain electrode DE to be described later.

A first insulating layer 220 may be disposed on the semiconductor layer including the semiconductor pattern ACT. In an embodiment of the inventive concept, the first insulating layer 220 may be a gate insulating layer. The first insulating layer 220 may be made of any one or a mixture of one or more of inorganic insulating materials such as silicon oxide (SiOx) and silicon nitride (SiNx) and organic insulating materials such as benzocyclobutene (BCB), acrylic materials and polyimide.

With continued reference to FIG. 5, a gate conductor including a gate electrode GE may be disposed on the first insulating layer 220. The gate electrode GE may overlap the semiconductor pattern ACT. The gate conductor may include, for example, any one or more of aluminum (Al)-based metal including aluminum alloys, silver (Ag)-based metal including silver alloys, copper (Cu)-based metal including copper alloys, molybdenum (Mo)-based metal including molybdenum alloys, chromium (Cr), titanium (Ti), and tantalum (Ta).

A second insulating layer 230 may be disposed on the gate conductor including the gate electrode GE. The second insulating layer 230 may be made of any one or a mixture of one or more of inorganic insulating materials such as silicon oxide (SiOx) and silicon nitride (SiNx) and organic insulating materials such as benzocyclobutene (BCB), acrylic materials and polyimide.

A data conductor including the source electrode SE and the drain electrode DE may be disposed on the second insulating layer 230. The source electrode SE and the drain electrode DE are disposed on the second insulating layer 230 to be spaced apart from each other. The data conductor may include one or more of a metal, an alloy, a metal nitride, a conductive metal oxide, and a transparent conductive material. In an embodiment of the inventive concept, the data conductor may have a single film structure or a multi-film structure composed of one or more of nickel (Ni), cobalt (Co), titanium (Ti), silver (Ag), copper (Cu), molybdenum (Mo), aluminum (Al), beryllium (Be), niobium (Nb), gold (Au), iron (Fe), selenium (Se), and tantalum (Ta). In addition, the source electrode SE and the drain electrode DE may be made of an alloy of any one of the above metals and one or more elements selected from titanium (Ti), zirconium (Zr), tungsten (W), tantalum (Ta), niobium (Nb), platinum (Pt), hafnium (Hf), oxygen (O) and nitrogen (N).

The semiconductor pattern ACT, the gate electrode GE, the source electrode SE and the drain electrode DE described above constitute a switching element TR2. In FIG. 3, the switching element TR2 is illustrated as a top gate type. However, the switching element TR2 is not limited to the top gate type. For example, the switching element TR2 can be formed as a bottom gate type.

A planarization layer 240 may be disposed on the data conductor. The planarization layer 240 may remove steps, thereby increasing the luminous efficiency of a pixel electrode 250 and an organic light emitting layer 270 which will be described later. The planarization layer 240 may include an organic material in an embodiment of the inventive concept. For example, the planarization layer 240 may include any one or more of polyimide, polyacryl, and polysiloxane. In an embodiment of the inventive concept, the planarization layer 240 may include an inorganic material or a composite of an inorganic material and an organic material. A first contact hole CNT1 may be formed in the planarization layer 240 to expose at least a part of the drain electrode DE.

The pixel electrode 250 may be disposed on the planarization layer 240. The pixel electrode 250 may be electrically connected to the drain electrode DE exposed by the first contact hole CNT1. For example, the pixel electrode 250 may be an anode which is a hole injection electrode. When formed as an anode, the pixel electrode 250 may include a material having a high work function to facilitate hole injection. In addition, the pixel electrode 250 may be a reflective electrode, a transflective electrode, or a transmissive electrode. In an embodiment of the inventive concept, the pixel electrode 250 may include a reflective material. In an embodiment of the inventive concept, the reflective material may include one or more of silver (Ag), magnesium (Mg), chromium (Cr), gold (Au), platinum (Pt), nickel (Ni), copper (Cu), tungsten (W), aluminum (Al), aluminum-lithium (Al—Li), magnesium-indium (Mg—In), and magnesium-silver (Mg—Ag).

In an embodiment of the inventive concept, the pixel electrode 250 may be formed as a single film. Alternatively, the pixel electrode 250 may be formed as a multi-film in which two or more materials are stacked.

When formed as a multi-film, the pixel electrode 250 may include, in an embodiment of the inventive concept, a reflective film and a transparent or translucent electrode disposed on the reflective film. In an embodiment of the inventive concept, the pixel electrode 250 may include a reflective film and a transparent or translucent electrode disposed under the reflective film. For example, the pixel electrode 250 may have a three-layer structure of ITO/Ag/ITO.

The transparent or translucent electrode discussed hereinabove may be made of one or more of indium tin oxide (ITO), indium zinc oxide (IZO), zinc oxide (ZnO), indium oxide ($In_2O_3$), indium gallium oxide (IGO) and aluminum zinc oxide (AZO).

A pixel defining layer 260 may be disposed on the pixel electrode 250. The pixel defining layer 260 includes an opening that at least partially exposes the pixel electrode 250. The pixel defining layer 260 may include an organic material or an inorganic material. In an embodiment of the inventive concept, the pixel defining layer 260 may include a material such as photoresist, polyimide resin, acrylic resin, a silicon compound, or polyacrylic resin.

The organic light emitting layer 270 may be disposed on the pixel electrode 250 and the pixel defining layer 260. For example, the organic light emitting layer 270 may be disposed on an area of the pixel electrode 250 which is exposed through the opening of the pixel defining layer 260. In an embodiment of the inventive concept, the organic light emitting layer 270 may at least partially cover sidewalk of the pixel defining layer 260.

In an embodiment of the inventive concept, the organic light emitting layer 270 may emit light of one of red, blue and green colors. In an embodiment, the organic light emitting layer 270 may emit white light or emit light of one of cyan, magenta and yellow colors. When the organic light emitting layer 270 emits white light, it may include a white light emitting material or may have a stack of a red light emitting layer, a green light emitting layer and a blue light emitting layer.

A common electrode 280 may be disposed on the organic light emitting layer 270 and the pixel defining layer 260. In an embodiment of the inventive concept, the common electrode 280 may be formed over the entire surface of the organic light emitting layer 270 and the pixel defining layer 260. In an embodiment of the inventive concept, the common electrode 280 may be a cathode. In an embodiment of the inventive concept, the common electrode 280 may include one or more of Li. Ca, Lif/Ca, LiF/Al, Al, Ag, and Mg. In addition, the common electrode 280 may be made of a material having a low work function. In an embodiment of the inventive concept, the common electrode 280 may be a transparent or translucent electrode including any one or more of indium tin oxide (ITO), indium zinc oxide (IZO), zinc oxide (ZnO), indium oxide ($In_2O_3$), indium gallium oxide (IGO), and aluminum zinc oxide (AZO).

The pixel electrode 250, the organic light emitting layer 270 and the common electrode 280 described above may constitute an organic light emitting diode OLED. However, the organic light emitting diode OLED is not limited to this configuration and may be a multilayer structure further including a hole injection layer (HIL), a hole transport layer (HTL), an electron transport layer (ETL), and an electron injection layer (EIL). In an embodiment of the inventive concept, electrodes attached to the OLED may be constructed of graphene.

The second substrate 290 may be arranged to face the first substrate 110. The second substrate 290 may be bonded to the first substrate 110 by a sealing member. The second substrate 290 may be a transparent insulating substrate in an embodiment. When the second substrate 290 is a transparent insulating substrate, the transparent insulating substrate may be a glass substrate, a quartz substrate, a transparent resin substrate, or the like.

The input sensing unit TU may be disposed on the second substrate 290. The input sensing unit TU may obtain coordinate information from an external input, for example, a touch. For example, the input sensing unit TU may be, in an embodiment, a touch unit that senses a user's touch.

In an embodiment of the inventive concept, the input sensing unit TU may sense an external input using a capacitive method. In an embodiment of the inventive concept, the input sensing unit TU may sense an input using an electromagnetic induction method.

Referring again to FIG. 1, a polarizing layer POL may be disposed on the input sensing unit TU.

In an embodiment of the inventive concept, the polarizing layer POL may reduce the reflectance of external light incident from the outside. To this end, the polarizing layer POL may include a retarder and/or a polarizer.

In an embodiment of the inventive concept, the polarizing layer POL may be omitted. When the polarizing layer POL is omitted, a black matrix (not illustrated) and a color filter (not illustrated) may be disposed on the second substrate 290 to enhance color separation due to reflection of external light.

The window W may be disposed on the polarizing layer POL. In an embodiment of the inventive concept, the window W may be made of transparent glass, plastic. For example, the window W may be made of a light transmitting material.

In an embodiment, the window W may be flexible. In other words, the window W may be made of a bendable, foldable or rollable material or structure to become bendable, foldable or rollable. In addition, the window may be comprised of a material that is suitable to transmit an externally applied pressure to the piezoelectric element. A person of ordinary skill in the art should understand and appreciate that various display windows already in use in devices such as smartphones, tablets, etc. would typically provide sufficient transfer of pressure to a piezoelectric element touched by an object such as a stylus, or a finger. For a non-limiting example, the window may be constructed of a glass ranging between 0.5 mm to 3 mm thick. Again, such a range of thickness is provided for illustrative purposes, and embodiments of the inventive concept are not limited to the aforementioned range or material. The window may be thinner or thicker than described in the illustrative example, and may be constructed of, for example, plastic.

Hereinafter, display devices according to other embodiments of the inventive concept will be described. Some of the elements described below may be substantially the same as those of the display device according to the above-described embodiment, and thus a description thereof will be omitted to avoid redundancy.

Figure 6:
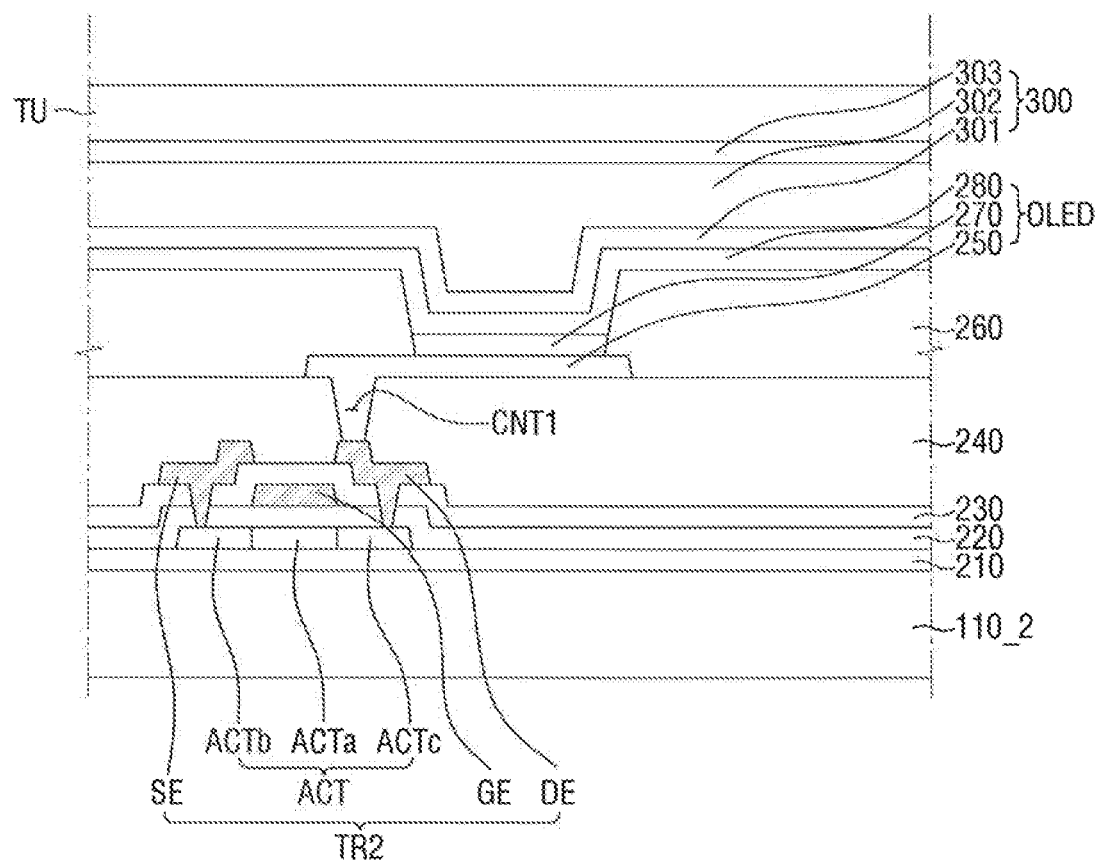
FIG. 6 is a partial cross-sectional view of a display device according to an embodiment of the inventive concept.

FIG. 6 is a partial cross-sectional view of a display device according to an embodiment of the inventive concept.

Referring to FIG. 6, an encapsulation layer 300 may be disposed on a first substrate 110_2 in an embodiment of the inventive concept.

The encapsulation layer 300 may prevent moisture and air that can be introduced from the outside. The encapsulation layer 300 may include a first inorganic layer 301, an organic layer 302, and a second inorganic layer 303 in an embodiment.

The first inorganic layer 301 may be disposed on a common electrode 280. The first inorganic layer 301 may include any one or more of silicon oxide (SiOx), silicon nitride (SiNx), and silicon oxynitride (SiONx).

The organic layer 302 may be disposed on the first inorganic layer 301. The organic layer 302 may include any one or more of epoxy, acrylate, and urethane acrylate. The organic layer 302 may planarize a step formed by a pixel defining layer 260.

The second inorganic layer 303 may be disposed on the organic layer 302. The second inorganic layer 303 may include any one or more of silicon oxide (SiOx), silicon nitride (SiNx), and silicon oxynitride (SiONx).

In FIG. 6, each of the first inorganic layer 301, the organic layer 302, and the second inorganic layer 303 is illustrated as a single layer. However, embodiments are not limited to this case. For example, at least one of the first inorganic layer 301, the organic layer 302, and the second inorganic layer 303 may be formed in a multilayer structure.

In an embodiment, the encapsulation layer 300 may include a hexamethyldisiloxane (HMDSO) layer. For example, the encapsulation layer 300 may include a first inorganic layer 301, a second inorganic layer 303, and an HMDSO layer disposed between the first inorganic layer 301 and the second inorganic layer 303. For example, the above-described organic layer 302 can be replaced with the HMDSO layer.

In an embodiment of the inventive concept, the HMDSO layer may be formed after the formation of the first inorganic layer 301 in the same chamber in which the first inorganic layer 301 was formed. Thus, the process of forming the encapsulation layer 300 can be simplified. In addition, the encapsulation layer 300 may have sufficient flexibility by including the HMDSO layer that can absorb stress.

An input sensing unit TU may be disposed on the encapsulation layer 300. The input sensing unit TU may be substantially the same as that described above with reference to FIG. 5.

Figure 7:
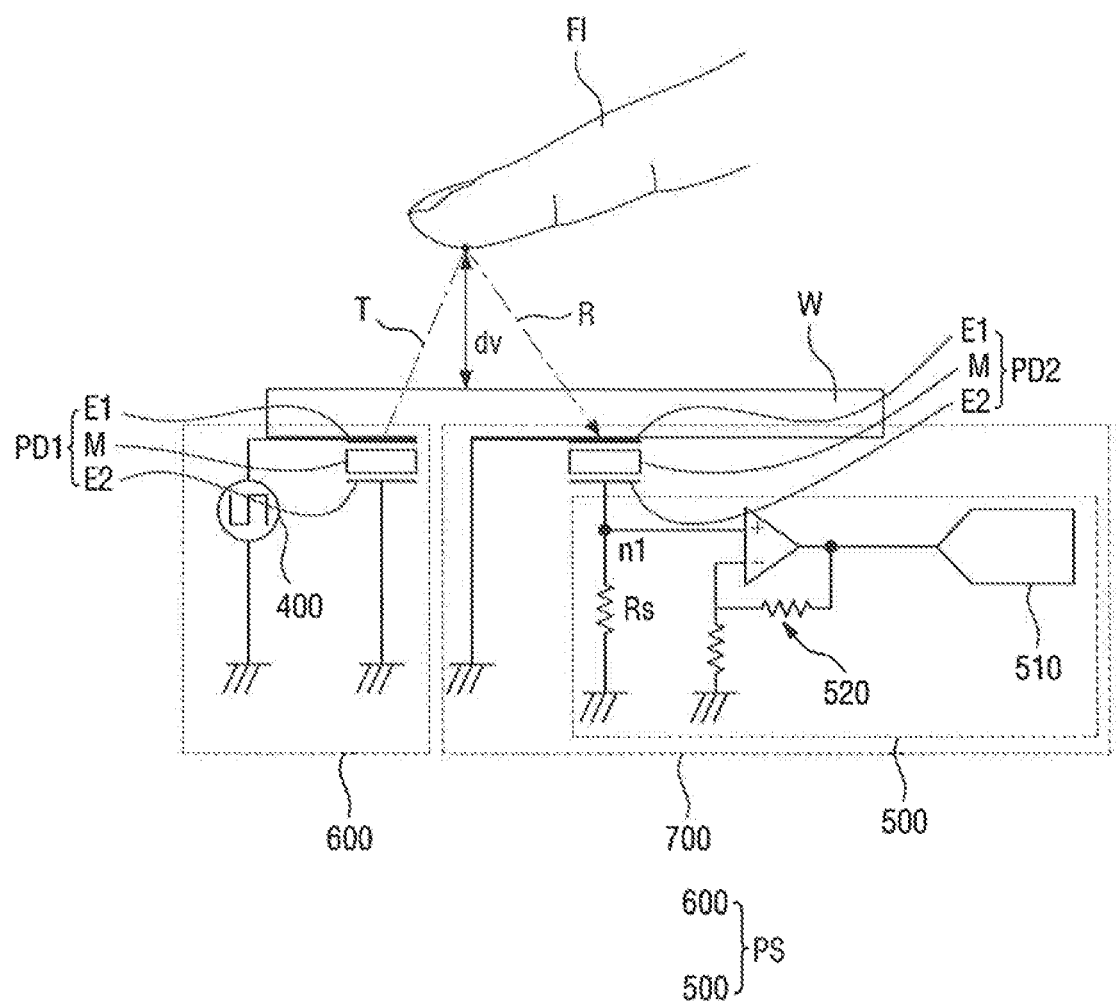
FIG. 7 is a schematic conceptual diagram of a display device according to an embodiment of the inventive concept.

FIG. 7 is a schematic conceptual diagram of a display device according to an embodiment of the inventive concept. Referring to FIG. 7, a piezoelectric sensor PS may be a distance sensor.

In an embodiment of the inventive concept, the piezoelectric sensor PS may include a transmitter 600 and a receiver 700.

The transmitter 600 may include an AC voltage generator 400 and a first piezoelectric element PD1. The AC voltage generator 400 may apply a voltage having a resonance frequency to the first piezoelectric element PD1. When the AC voltage generator 400 applies an AC voltage to the first piezoelectric element PD1, the first piezoelectric element PD1 may vibrate to generate an ultrasonic signal T.

The receiver 700 may include a second piezoelectric element PD2 and a sensing circuit 500.

The ultrasonic signal T provided from the transmitter 600 may hit an object (a finger F1 in FIG. 7) and then be reflected to the receiver 700. For ease of description, a signal returned after hitting an object will be referred to as a reflected signal R.

The reflected signal R may be provided to the second piezoelectric element PD2 to stimulate the second piezoelectric element PD2. In other words, the reflected signal R including ultrasonic waves may vibrate the second piezoelectric element PD2. When the second piezoelectric element PD2 vibrates, the second piezoelectric element PD2 may generate a voltage, and the sensing circuit 500 may measure a current flowing through a sensing resistor Rs based on the voltage generated by the second piezoelectric element PD2. An exemplary operation will now be described with reference to FIG. 8.

Figure 8:
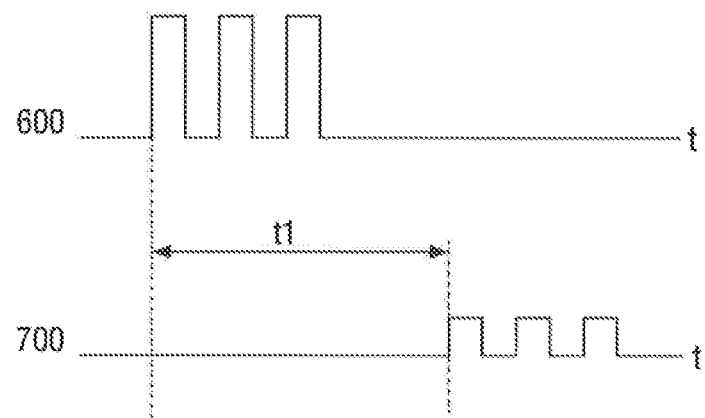
FIG. 8 is a graph illustrating signal waveforms of a transmitter and a receiver.

FIG. 8 is a graph illustrating signal waveforms of the transmitter 600 and the receiver 700.

In an embodiment of the inventive concept, when the transmitter 600 transmits the ultrasonic signal T, the receiver 700 may receive the reflected signal R after a lapse of a first time t1.

A controller (not illustrated) connected to the sensing circuit 500 may calculate the first time t1 based on the above signals.

When the first time t1 is calculated, the controller may calculate a vertical distance dv between the object and the display device based on the speed of the above signals and the first time t1.

Figure 9:
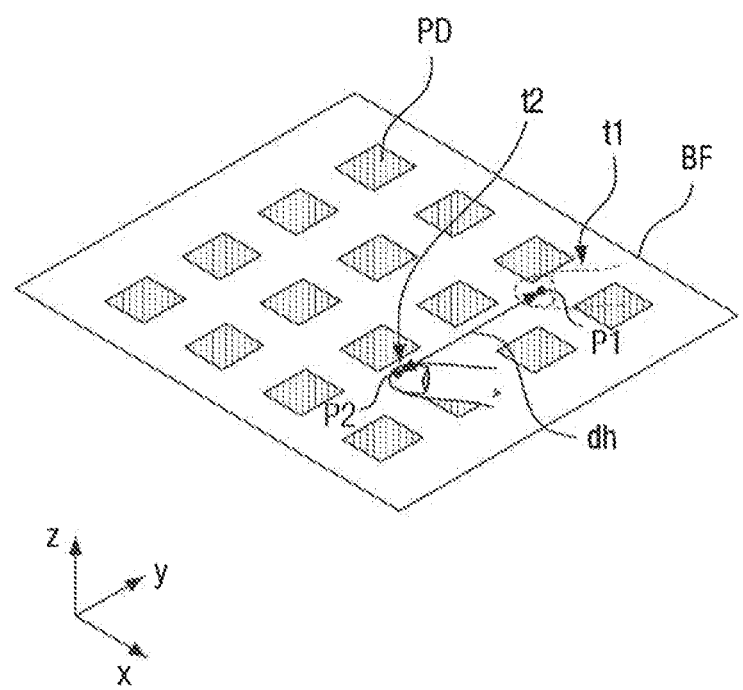
FIG. 9 is a partial perspective view of a display device according to an embodiment of the inventive concept.

FIG. 9 is a partial perspective view of a display device according to an embodiment of the inventive concept.

Referring to FIG. 9, in an embodiment of the inventive concept, a plurality of piezoelectric elements PD may be arranged on a base film BF along a plurality of rows and a plurality of columns.

Each of the piezoelectric elements PD may be the first or second piezoelectric element PD1 or PD2 described above with reference to FIG. 7, or may be a third piezoelectric element PD3 to be described with reference to FIG. 10.

When the piezoelectric elements PD are disposed along the rows and the columns, if an object moves on the display device at a distance from the display device, a piezoelectric sensor PS may calculate a horizontal distance of the object.

For example, when the piezoelectric sensor PS includes a plurality of receivers 700, a controller may make each of the receivers 700 correspond to position information on an x-y plane.

For example, in an embodiment of the inventive concept, the controller may map a first position p1 of an object at a first time t1 and a second position p2 of the object at a second time t2 on the x-y plane.

In this case, the controller can calculate a horizontal distance dh between the first position p1 and the second position p2 by comparing the first position p1 and the second position p2 mapped on the x-y plane.

Figure 10:
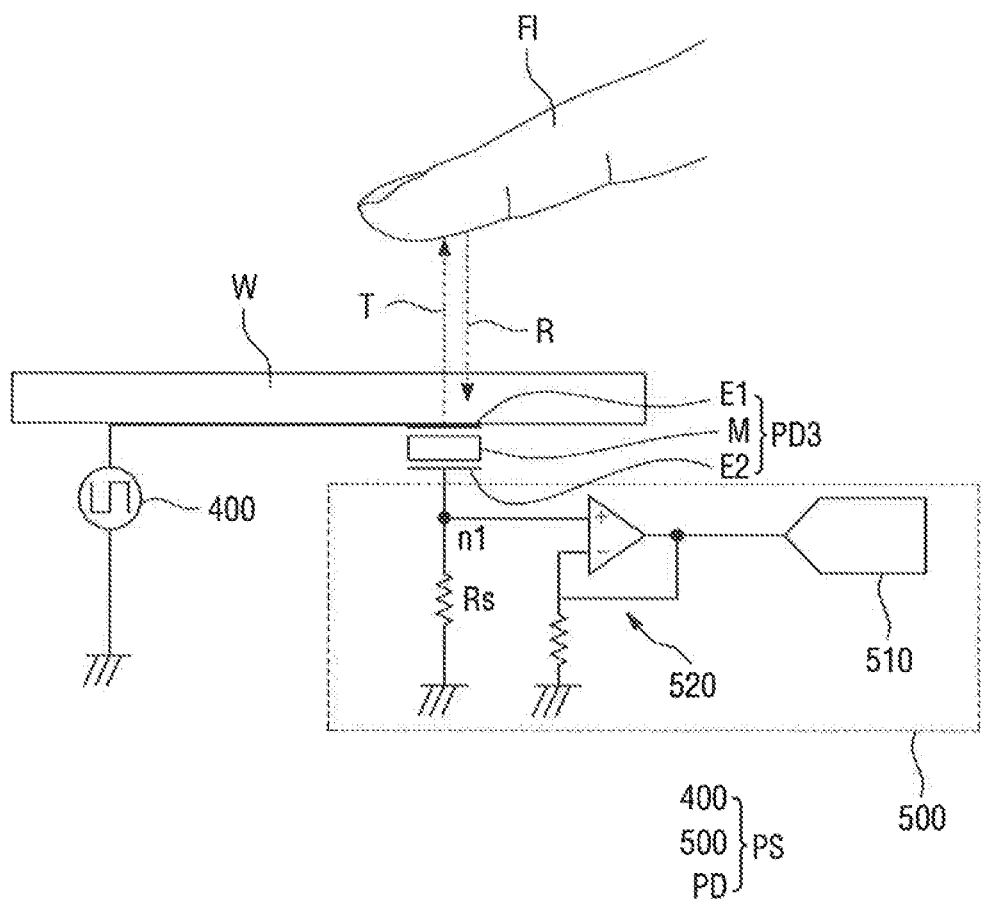
FIG. 10 is a schematic conceptual diagram of a display device according to an embodiment of the inventive concept.

FIG. 10 is a schematic conceptual diagram of a display device according to an embodiment of the inventive concept.

Referring to FIG. 10, in an embodiment of the inventive concept, the transmitter 600 and the receiver 700 of FIG. 7 may be integrated. For example, the first piezoelectric element PD1 and the second piezoelectric element PD2 may be integrated. In other words, one piezoelectric element PD3 may simultaneously perform the functions of the first piezoelectric element PD1 and the second piezoelectric element PD2. This piezoelectric element will be referred to as a third piezoelectric element PD3.

In an embodiment of the inventive concept, the third piezoelectric element PD3 may simultaneously perform the functions of a receiver and a transmitter.

A first electrode E1 of the third piezoelectric element PD3 may be connected to an AC voltage generator 400. When the AC voltage generator 400 applies a voltage having a resonance frequency, the third piezoelectric element PD3 may generate an ultrasonic signal T.

In addition, a second electrode E2 of the third piezoelectric element PD3 may be connected to a sensing circuit 500.

The ultrasonic signal T may be reflected by an object to become a reflected signal R, and the reflected signal R may vibrate the third piezoelectric element PD3. When the third piezoelectric element PD3 vibrates, a voltage or current may be generated in the third piezoelectric element PD3. Therefore, the sensing circuit 500 can sense the reflected signal R.

For example, as described above with reference to FIG. 8, a piezoelectric sensor PS can calculate the arrival time of a reflected signal R and calculate a vertical distance based on the arrival time of the reflected signal R.

Figure 11:
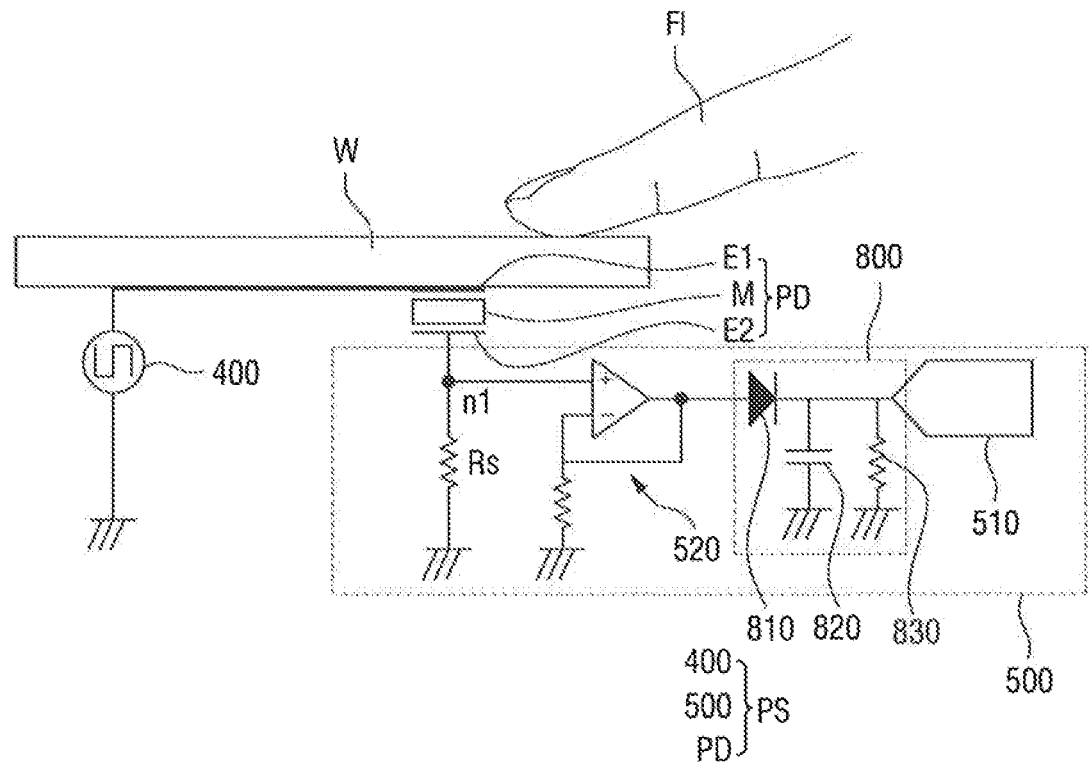
FIG. 11 is a schematic conceptual diagram of a display device according to an embodiment of the inventive concept.

FIG. 11 is a schematic conceptual diagram of a display device according to an embodiment of the inventive concept. As shown in this embodiment of the inventive concept, a sensing circuit 500 may further include a rectifier circuit 800 electrically connected between the analog-to-digital converter 510 and the amplifier 520.

In an embodiment of the inventive concept, the rectifier circuit 800 may filter a signal amplified by an amplifier 520 and provide the filtered signal to an analog-to-digital converter 510.

For example, the signal amplified by the amplifier 520 has a certain waveform (e.g., a sine wave or a square wave), and the rectifier circuit 800 may provide a peak value of the signal amplified by the amplifier 520 to the analog-to-digital converter 510 as a direct current (DC) voltage. A person of ordinary skill in the art should understand and appreciate, for example, the one-way properties of the diode 810 may cause the signal from the AC voltage generator 400 to be output by the diode 810 as pulsating DC voltage. The rectifying capacitor 820 may be energized and then discharged as the rectified voltage from the diode drops. The rectifying capacitor may serve to smooth the signal provided to the analog-to-digital converter 510. Accordingly, the analog-to-digital converter 510 may convert the filtered analog signal into a digital signal.

In an embodiment of the inventive concept, the rectifier circuit 800 may include a first diode 810, a rectifying capacitor 820, and a rectifying resistor 830. The rectifier circuit 800 can be broadly understood as an element that performs the above-described functions.

Figure 12:
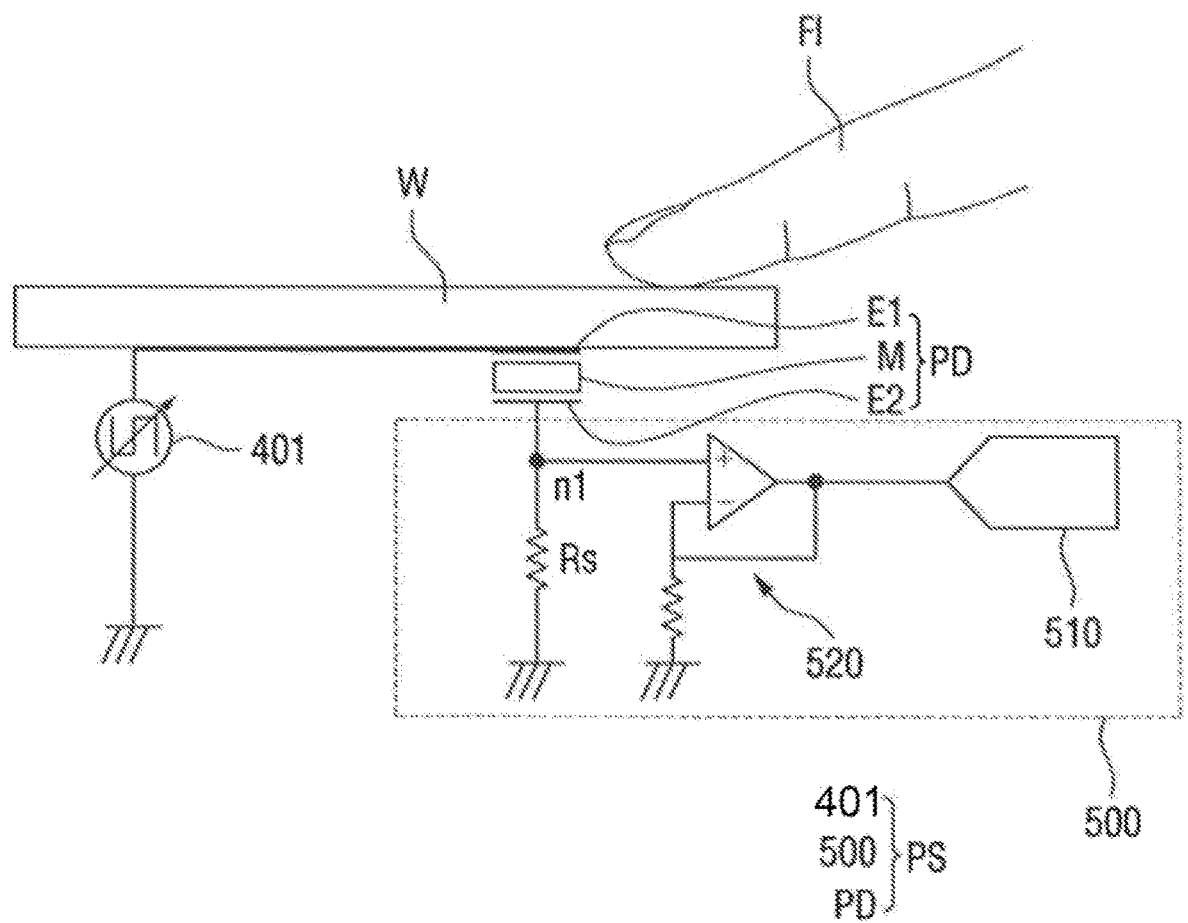
FIG. 12 is a schematic conceptual diagram of a display device according to an embodiment of the inventive concept.

FIG. 12 is a schematic conceptual diagram of a display device according to an embodiment of the inventive concept. Referring to FIG. 12, an AC voltage generator 401 may provide a continuously varying frequency to a piezoelectric element PD.

When the AC voltage generator 401 provides a continuously varying frequency to the piezoelectric element PD, a sensing circuit 500 may measure the impedance presented to the piezoelectric element PD.

Accordingly, if a frequency causing the piezoelectric element PD to have a minimum impedance value is found, this frequency may be designated as a first resonance frequency.

Then, when pressure is applied to the piezoelectric element PD, the vibration of the piezoelectric element PD is affected, which, in turn, affects the impedance waveform.

For example, in a state where pressure is applied to the piezoelectric element PD, a frequency (referred to as a second resonance frequency) causing the piezoelectric element PD to have a minimum impedance value can be found.

Since the impedance is different when no pressure is applied and when pressure is applied, the first resonance frequency and the second resonance frequency may be different from each other.

For example, a piezoelectric sensor PS can sense the pressure applied to the display device by utilizing the fact that the first resonance frequency is shifted according to pressure.

Figure 13:
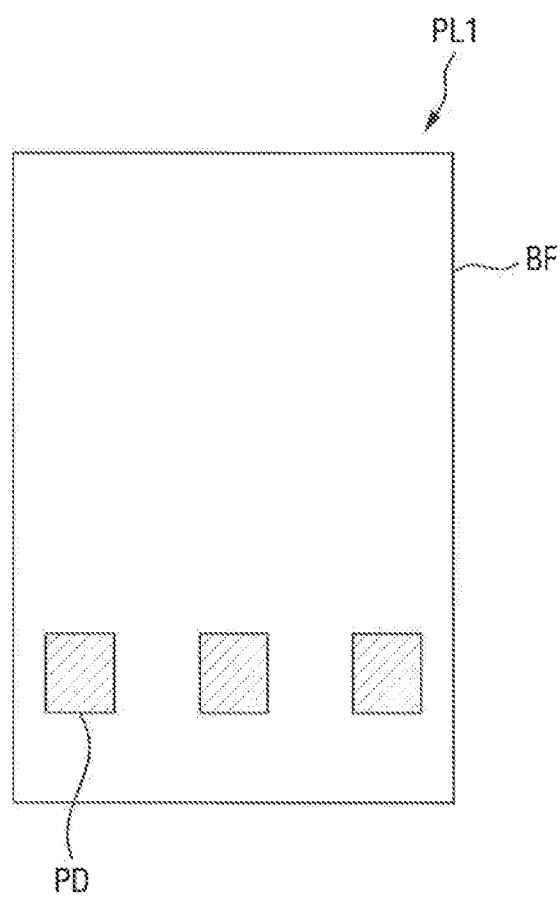
FIG. 13 is a partial layout view of a display device according to an embodiment of the inventive concept.

FIG. 13 is a partial layout view of a display device according to an embodiment of the inventive concept.

In FIG. 13, a piezoelectric sensor layer PL1 includes a plurality of piezoelectric elements PD.

As illustrated in FIG. 1, the piezoelectric elements PD may be arranged regularly in a plurality of rows and a plurality of columns. However, in an embodiment of the inventive concept, the piezoelectric elements PD may be arranged only in a specific area.

The piezoelectric elements PD are not visible to a user through a window W. Even in this case, when a user applies pressure to a portion of the window corresponding to a piezoelectric element PD or moves a finger, the piezoelectric element PD can sense such stimulation.

For example, the piezoelectric elements PD can be placed in a specific area of the display device to perform specific functions.

Figure 14:
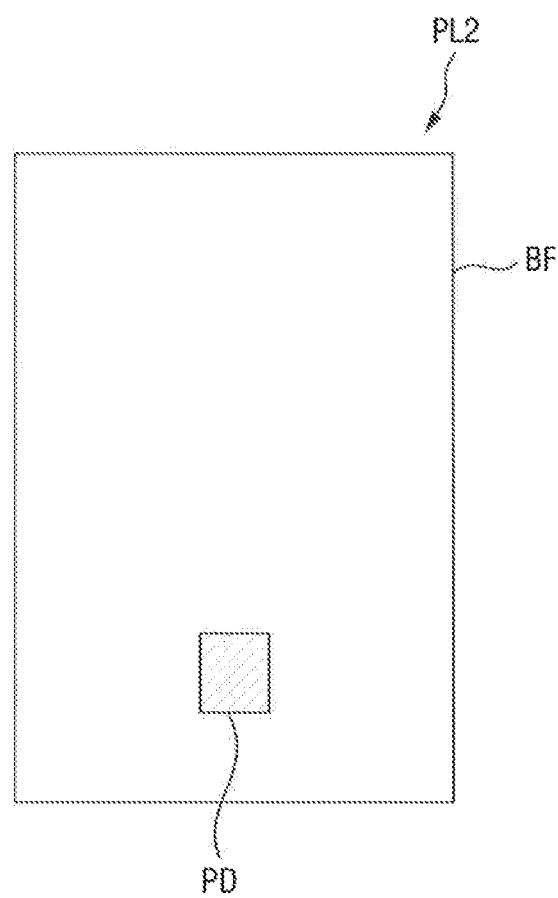
FIG. 14 is a partial layout view of a display device according to an embodiment of the inventive concept.

FIG. 14 is a partial layout view of a display device according to an embodiment of the inventive concept.

In FIG. 14, a piezoelectric sensor layer PL2 includes one piezoelectric element PD.

In this case, the piezoelectric element PD may function as a button performing a specific function in a specific area of the display device.

For example, in a display device without a home button on a window, the piezoelectric element PD may at least partially perform the function of the home button.

Figure 15:
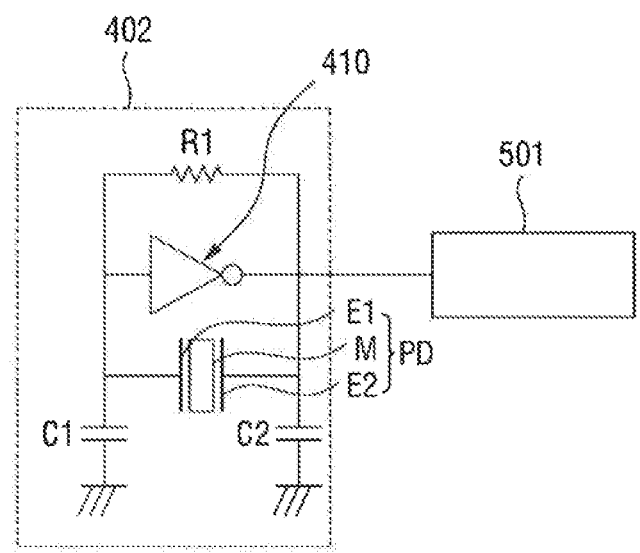
FIG. 15 is a schematic conceptual diagram of a display device according to an embodiment of the inventive concept.

FIG. 15 is a schematic conceptual diagram of a display device according to an embodiment of the inventive concept.

Referring to FIG. 15, an AC voltage generator and a piezoelectric element PD may be integrated in an embodiment of the inventive concept.

In an embodiment of the inventive concept, a piezoelectric sensor may include an oscillation circuit 402.

For example, the piezoelectric sensor may include a first resistor R1, an amplifier 410 and the piezoelectric element PD connected in parallel to each other, a first capacitor C1 connected to an end of each of the first resistor R1, the amplifier 410 and the piezoelectric element PD, and a second capacitor C2 connected to the other end of each of the first resistor R1, the amplifier 410 and the piezoelectric element PD.

For example, the first resistor R1, the amplifier 410, the piezoelectric element PD, the first capacitor C1, and the second capacitor C2 may form one oscillation circuit 402.

The first resistor R1, the amplifier 410, and the piezoelectric element PD may be connected in parallel to each other.

An end of each of the first resistor R1, the amplifier 410 and the piezoelectric element PD may be connected to an electrode of the first capacitor C1, and the other end of each of the first resistor R1, the amplifier 410 and the piezoelectric element PD may be connected to an electrode of the second capacitor C2.

In this case, the other electrode of the first capacitor C1 and the other electrode of the second capacitor C2 may be grounded.

Referring to FIG. 3, an inductance area IA may be defined. The inductance area IA may be defined as an area between the resonance frequency RF and the anti-resonance frequency ARF.

In the inductance area IA, the piezoelectric element PD may perform the function of an inductor.

For example, in the inductance area IA, the piezoelectric element PD may serve as an inductor of the oscillation circuit 402.

In an embodiment of the inventive concept, the AC voltage generator may include the first resistor R1, the amplifier 410, and the piezoelectric element PD. For example, unlike in the embodiment of FIG. 1, the piezoelectric element PD may be included in the AC voltage generator. In other words, the piezoelectric element PD and the AC voltage generator may be integrated.

Next, the operation of the AC voltage generator will be described. As described above, when pressure is applied to the piezoelectric element PD, the impedance of the piezoelectric element PD may change. Accordingly, the resonance frequency of the piezoelectric element PD may be shifted, and a sensing circuit 501 may sense the shifted resonance frequency. For example, the sensing circuit 501 can identify whether pressure has been applied to the piezoelectric element PD by sensing whether the resonance frequency has been shifted.

Figure 16:
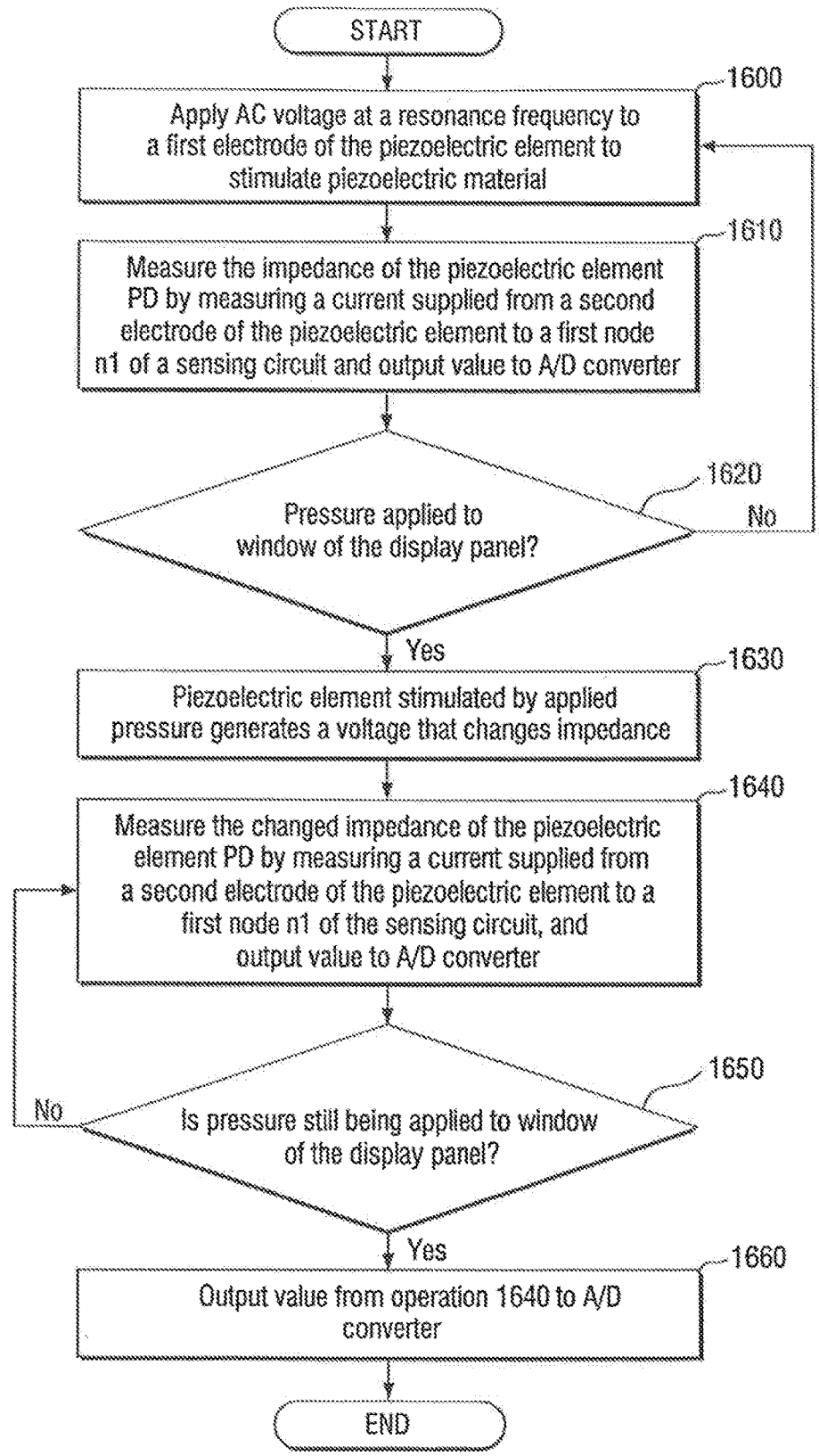
FIG. 16 is a flowchart illustrative of one non-limiting way a display device may operate according to an embodiment of the present inventive concept.

FIG. 16 is a flowchart illustrative of one non-limiting way a display device may operate according to an embodiment of the present inventive concept.

At operation 1600, AC voltage from, for example, an AC generator is supplied at a resonant frequency is applied to a first electrode of the piezoelectric element.

At operation 1610, the impedance of the piezoelectric element is measured by measuring a current supplied from a second electrode of the piezoelectric element PD to a first node of a sensing circuit. For example, FIG. 2 shows how the second electrode E2 outputs current to the node n1. The measured current may then be output (optionally via amplifier 520) to the A/D converter 510. After conversion to a digital signal, the A/D converter of the sensing circuit may provide this digital signal to, for example, a controller (not shown).

At operation 1620, a stylus or a finger, for example, may press down on the window of the display panel.

At operation 1630 the pressure on the piezoelectric material M of the piezoelectric element PD changes the output from the second electrode E2 because of the pressure applied because the impedance of the piezoelectric element changes with a change in pressure.

At operation 1640 the changed impedance of the piezoelectric element is measured by measuring a current supplied from the second electrode of the piezoelectric element to the first node n1 of the sensing circuit. This operation is similar to operation 1610. This changed value of current is provided to the A/D converter 510 (optionally via the amplifier 520). As previously discussed, the A/D converter may output a digital signal representing the measured value of the current to, for example, a controller.

At operation 1650, there may be a periodic determination as to whether pressure is still being applied to the window of the display panel. If the amount of pressure is about the same, the impedance of the piezoelectric element should be about the same, and may be periodically (in an embodiment) output.

If the pressure is no longer being applied, or the pressure has changed to a different value, then operation 1640 may be performed again to measure the changed impedance of the piezoelectric element by measuring a current supplied from a second electrode (e.g. E2 in FIG. 2) of the piezoelectric element to a first node of the sensing circuit.

The operation in FIG. 16 then ends. A person of ordinary skill in the art should understand and appreciate that for the other embodiments shown and described herein, the operations illustrated in FIG. 16 may be the same or similar as described herein above. The complexity of the sensing circuit, for example, and the piezoelectric element, may have operations somewhat different to FIG. 16.

In an embodiment of the inventive concept, the sensing circuit 501 may include a frequency counter. When the sensing circuit 501 includes a frequency counter, it can identify whether the resonance frequency has been shifted without using an analog-digital converter.

According to embodiments of the inventive concept, it is possible to precisely sense the pressure externally applied to the window of a display panel.

In addition, it is possible to measure the distance between an external object and a display device or the distance traveled by the external object.

However, the embodiments of the inventive concept are not restricted to the one set forth herein. The above embodiments will become more apparent to one of ordinary skill in the art to which the embodiments pertain by referencing the claims.

While some embodiments of the inventive concept have been particularly illustrated and described herein, it will be understood by those of ordinary skill in the art that various changes in form and detail may be made therein. Such changes in form and detail do not depart from the spirit and scope of the embodiments of the inventive concept as defined by the following claims. The exemplary embodiments of the inventive concept should be considered in a descriptive sense only and not for purposes of limitation.

What is claimed is:

1. A display device comprising:
   a piezoelectric sensor layer including a piezoelectric sensor comprising a piezoelectric element;
   a display panel disposed on the piezoelectric sensor layer; and
   an alternating current (AC) voltage generator, wherein the piezoelectric element is included in the AC voltage generator,
   wherein the piezoelectric sensor includes a sensing circuit, and wherein the sensing circuit is configured to measure a change in impedance of the piezoelectric element when an AC voltage having a resonance frequency of the piezoelectric element is input to the piezoelectric element,
   wherein the piezoelectric sensor includes an oscillation circuit comprising the piezoelectric element, and wherein the sensing circuit is connected to the oscillation circuit, and
   wherein the sensing circuit comprises a frequency counter, which is configured to indicate whether the resonance frequency is shifted or not.

2. The display device of claim 1, wherein the piezoelectric element of the piezoelectric sensor comprises a first electrode, a second electrode facing the first electrode, and a piezoelectric material disposed between the first electrode and the second electrode, and
   wherein the AC voltage generator is connected to the first electrode, and the AC voltage generator is configured to provide the AC voltage having the resonance frequency to the piezoelectric element.

3. The display device of claim 2, wherein the sensing circuit comprises:
   a first node connected to the second electrode;
   a sensing resistor and an amplifier connected to the first node; and
   an analog-to-digital converter connected to the amplifier.

4. The display device of claim 3, further comprising a rectifier circuit electrically connected between the amplifier and the analog-to-digital converter.

5. The display device of claim 1, wherein an impedance value of the piezoelectric element increases when an external pressure on the display panel increases.

6. The display device of claim 1, wherein the piezoelectric sensor layer further comprises:
   a base film having the piezoelectric element disposed thereon;
   a pad disposed on the base film; and
   an input line connecting the pad and the piezoelectric element.

7. The display device according to claim 6, wherein the piezoelectric element comprises a plurality of piezoelectric elements disposed on the base film in an array.

8. The display device of claim 6, wherein the display panel includes a driving integrated circuit, and the pad is electrically connected to the driving integrated circuit.

9. The display device of claim 8, wherein the driving integrated circuit comprises a plurality of analog-to-digital converters, and the piezoelectric element is connected to the plurality of analog-to-digital converters.

10. The display device of claim 1, further comprising an input sensing unit disposed on the display panel.

11. The display device of claim 1, further comprising a window disposed on the display panel.

12. The display panel of claim 11, wherein the window is comprised of a material that transmits an externally applied pressure to the piezoelectric element.

13. The display device of claim 1, wherein the display panel includes a plurality of pixels, and each of the pixels comprises a pixel electrode, a common electrode facing the pixel electrode, and an organic light emitting layer disposed between the pixel electrode and the common electrode.

* * * * *